United States Patent [19]
LaBarre et al.

[11] Patent Number: 5,222,028
[45] Date of Patent: Jun. 22, 1993

[54] PULSE ANALYSIS SYSTEM AND METHOD

[75] Inventors: Gary K. LaBarre, Lineboro; Timothy E. Gee, Parkton, both of Md.

[73] Assignee: Westinghouse Electric Corp., Pittsburgh, Pa.

[21] Appl. No.: 597,909

[22] Filed: Oct. 12, 1990

[51] Int. Cl.$^5$ .................................. G01R 29/02
[52] U.S. Cl. ............................. 364/487; 364/486; 324/76.12; 328/111
[58] Field of Search ........... 364/481, 486, 487, 498; 324/77 R, 77 A; 328/108, 111, 115

[56] References Cited

U.S. PATENT DOCUMENTS

| | | | |
|---|---|---|---|
| 3,962,540 | 6/1976 | Kokado | 328/139 |
| 4,721,958 | 1/1988 | Jenkin | 342/13 |
| 4,794,324 | 12/1988 | Tracey et al. | 324/77 A |
| 4,904,947 | 2/1990 | Olivenbaum et al. | 328/111 |
| 5,003,248 | 3/1991 | Johnson | 364/487 |

FOREIGN PATENT DOCUMENTS

3207556A1 3/1982 Fed. Rep. of Germany .

OTHER PUBLICATIONS

Hewlett Packard Programming Note, Nov. 1980.

Primary Examiner—Thomas G. Black
Assistant Examiner—Michael Zanelli
Attorney, Agent, or Firm—Norman A. Nixon; John K. Williamson

[57] ABSTRACT

The invention is a system and method that uses a digital oscilloscope to digitize a waveform and then loads the digitized waveform into a computer. The computer scans the waveform data locating leading edges by comparing data to a rolling average and a noise threshold and locating tops and bottoms if the pulse is a negative going pulse by comparing data to slope criteria until a trailing edge is discovered. The trailing edge defines the end of the pulse, the immediately preceding leading edge defines the beginning of the pulse and the pulse height and this allows the pulse characteristics to be determined. This discovered pulse is removed from the waveform by setting all data values in the pulse to the pulse baseline value, and the scan for leading edges, pulse tops and a trailing edge is performed again to isolate and characterize another pulse. This cycle of detection, analysis and removal continues until the end of data is encountered before a pulse is discovered.

10 Claims, 10 Drawing Sheets

PULSE ANALYSIS SYSTEM AND METHOD

BACKGROUND OF THE INVENTION

1. Field of the Invention

The present invention is directed to a system that analyzes pulsed DC or AC signals to determine pulse characteristics and, more particularly, to a device independent system that will decompose a composite pulse and provide the characteristics of the pulses which comprise the composite pulse.

2. Description of the Related Art

Measurement of pulsed signals have been performed for many years in the fields of radar and communication system testing. Since such pulsed signals both AC and DC are very common and relatively simple to analyze, several techniques for measuring the characteristics associated with these pulsed signals have evolved. Many manufacturers have implemented pulse measuring capability within the programmable digitizing oscilloscopes currently available.

One of the common methods for performing pulsed signal analysis in the prior art is called the histogram plotting method. In this method, a table of voltage values is created. Each entry in the table corresponds to a vertical voltage value as defined by the cell resolution of the digitizing oscilloscope. That is, if the voltage range of the oscilloscope is set at 1-100 volts with a resolution of 1 volt (i.e. 1 volt per division or display cell of the display) the table would include 100 entries corresponding to the 100 vertical display cells. The histogram method counts the number of display cells which occur for each voltage level and enters the count into the appropriate location in the table. The voltage cell level table entry that has the highest count is assumed to be the pulse base value or baseline reference and the cell level with the second highest count is assumed to be the top of the pulse. The first cell along the time axis that has the top of the pulse value is assumed to be top front corner of the pulse or the end of the leading edge and the last cell along the time axis with the top of the pulse value is assumed to be the start of the trailing edge of the pulse or the top back corner. The pulse edges are assumed to be smooth for pulse width and other pulse characteristics. This method also assumes a duty cycle of less than 50% for the pulse and assumes that the pulse edges are substantially vertical. This method can confuse high frequency AC with a DC pulse and does not take into consideration noisy baselines, preshoot, overshoot and ringing problems. This method can also result in inaccurate location for the base and top pulse levels as well as the rising and falling edges. This method is not capable of handling even simple composite pulse signals because only two levels and two edges are determined. This method can also be confused by holes and spikes in the signal.

The second method is called the threshold method and requires knowledge of the likely pulse height ahead of time. In this method when the voltage value rises above a predetermined threshold, the pulse is considered to have started and when it falls below the predetermined threshold the pulse is considered to have ended. This locates the rising and falling edges and an assumption as to the pulse height provides the height pulse characteristic. This method will also not characterize composite pulses or pulses with holes or spikes therein.

A third method which is called the visual analysis method requires that the operator measure the pulse characteristics using the scale references on the digitizing oscilloscope. This method of course suffers from errors in consistency between operators and it is not simple for an operator to perform for a composite pulse.

Composite pulse waveforms consist of the additive composition of several pulses of varying amplitude and width into a single composite pulse. These types of signals are difficult to measure automatically due to their complex nature and the effects of noise, etc. Due to the relative infrequency of the need for measuring composite pulses, these signals have been generally relegated to manual measurements by the operator, that is, the third method discussed above. Since the presence of pulsed composites is becoming more and more prevalent in the state of art communications and radar equipment now being tested, and in the face of growing concern over test speed and validity, a repeatable, automatic method of performing pulse measurements of composite pulses is needed.

SUMMARY OF THE INVENTION

It is an object of the present invention to provide a pulse analysis system which is independent of the type of programmable digitizing oscilloscope used in the system.

It is another object of the present invention to provide a system that is not confused by missing, added, skewed, overlapped or inverted pulses.

It is an object of the present invention to support generic or standard pulse signals.

It is a further object of the present invention to use the actual measured data for pulse analysis.

It is an additional object to provide a system that will measure both AC and DC pulsed signals.

It is another object of the present invention to count the number of pulses in a signal.

It is also an object of the present invention to provide an analysis when only a single sample of the signal is available.

It is an object of the present invention to provide a method and a system that does not require visual analysis by the operator.

It is a further object of the present invention to provide a system which excludes noise from the analysis process.

It is also another object of the present invention to allow analysis of both positive and negative going pulses and composite combinations thereof.

It is an additional object of the present invention to provide display coordinates for the critical points of the pulse, so that the digitizing oscilloscope can highlight the appropriate portions of the waveform.

The above objects can be accomplished by a system and method that digitizes a waveform with an oscilloscope and loads the digitized waveform into a computer. The computer scans the waveform locating leading edges and tops of pulses until a trailing edge is discovered. The trailing edge allows the pulse characteristics of the pulse associated with the trailing edge to be determined. This discovered pulse is removed from the waveform and the scan for leading edges, pulse tops and a trailing edge is performed again to isolate and characterize another pulse. This cycle of pulse detection, analysis and removal continues until no more pulses remain.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
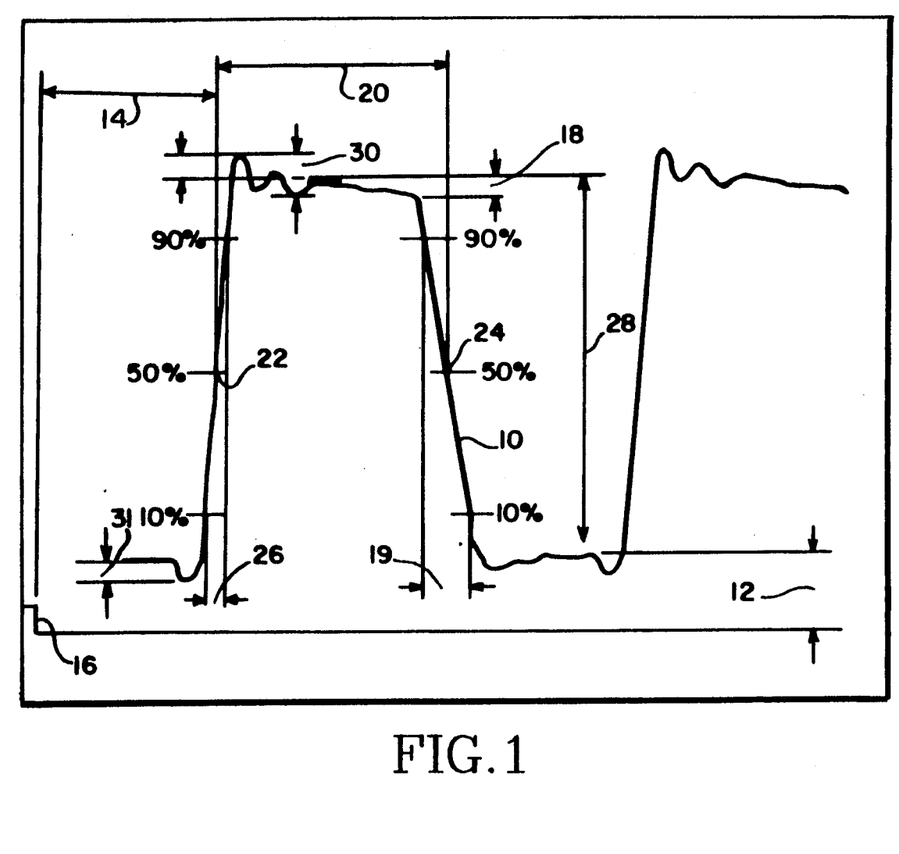
FIG. 1 illustrates an AC or DC pulse and the measurement characteristics of interest.

FIG. 1 illustrates a typical pulse 10 and the characteristics of the pulse which the present invention can determine and the characteristics of the analysis filters which can be set to remove noise from the pulse being analyzed. The present invention determines the reference baseline or DC offset voltage 12 on which the pulse signal being analyzed rides. If the signal is a composite signal, the DC offset or reference baseline of the entire waveform will be set by definition as the DC offset of the first pulse. Every other pulse will then have its own DC offset measurement. The present invention will also calculate the delay 14 of the pulse from the trigger signal 16 which is measured as the time between the 50% leading edge of a pulse point 22 and the scope trigger occurrence 16. However, the delay point percentage value can be set to any percentage of the measured amplitude of the pulse. The droop 18, that is, the difference between the normal pulse amplitude 28 and the amplitude at the end of the pulse expressed as a percentage of the normal pulse amplitude is also determined. The duty cycle or the ratio between the pulse width and the period of a signal expressed as a percentage is also determined. The fall time 19 defined as the time required for the signal to fall from 90% to 10% of its normal pulse amplitude 28 is determined by picking the digitized data points closest to these percentage levels. In this situation the calculations will be more accurate if care is taken to optimize the time scale so that as much data as possible pertaining to the pulse trailing edge is provided by the digitizing oscilloscope. The present invention also calculates the pulse width 20 which is the time between the leading edge 50% point 22 and the trailing edge 50% point 24 of the signal. The rise time 26 is also calculated which is the time required for the signal to rise from 10% to 90% of its normal pulse amplitude. Once again, if the time scale is optimized this measurement will be more accurate. The present invention also determines the normal pulse amplitude 28 as well as the peak voltage amplitude 30 as measured from the DC offset for that pulse.

Figure 2:
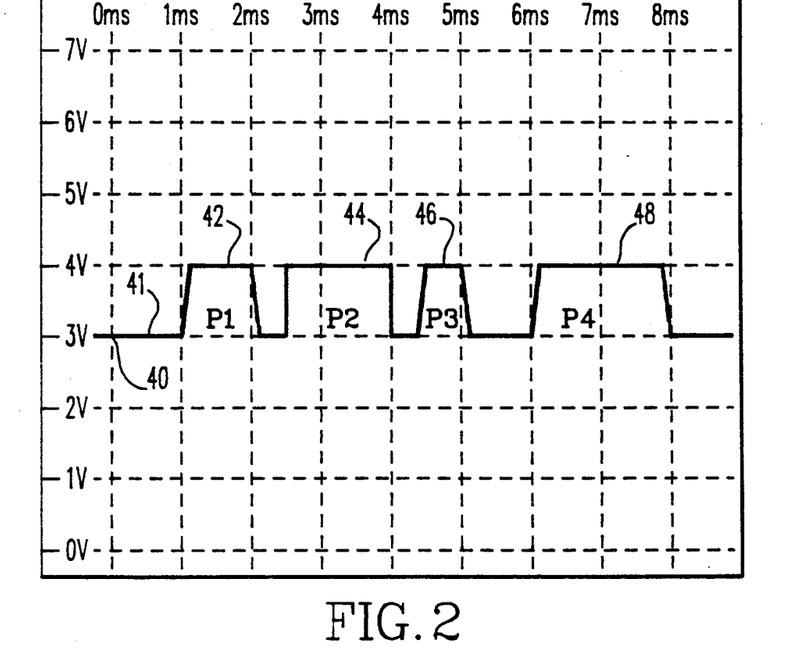
FIG. 2 illustrates a pulse train.

If a pulse train is being analyzed such as illustrated in FIG. 2, the number of pulses in the pulse train will be counted in addition to determining the characteristics of each pulse in the pulse train. If the signal is a composite pulse, the number of pulses that comprise the composite pulse will be counted. A burst of pulses can be measured in 0.5 increments thereby informing the operator that the scope display needs to be rescaled to capture the entire pulse train. The present invention can also provide the spacing between pulses, that is the time between the leading edge of the first pulse and the leading edge of a requested pulse as indicated by the pulse number input by the user. The present invention will also calculate the period of a repetitive signal and the pulse repetition frequency or the rate at which a pulsed signal repeats itself. Some of the parameters for the DC pulse train of FIG. 2 are illustrated in Table 1:

TABLE 1

| Pulse Number: | P1 | P2 | P3 | P4 |
|---|---|---|---|---|
| VOLTAGE | 1.0 V | 2.0 V | 1.0 V | 1.0 V |
| PULSE WIDTH | 1.0 ms | 1.5 ms | 0.5 ms | 2.0 ms |
| SPACING | 0 ms | 1.5 ms | 3.5 ms | 5.0 ms |
| DELAY FROM TRIGGER | 1.0 ms | 2.5 ms | 4.5 ms | 6.0 ms |

In addition to the above-mentioned parameters, the burst or pulse count for the FIG. 2 signal is 4, the DC offset for each pulse is 3 volts and the other characteristics such as rise time, droop etc. can also be produced.

Figure 3:
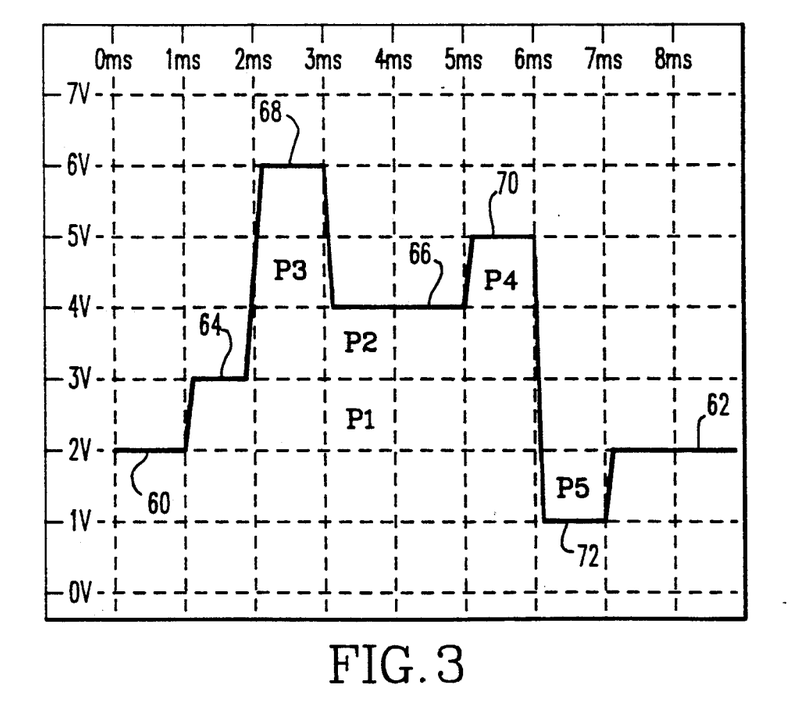
FIG. 3 depicts a composite pulse.

A composite pulse is a special case of a DC pulse train. An example of a composite pulse is illustrated in FIG. 3. In this figure the pulse count is 5. As can be seen in the figure, the pulses which make up the composite are numbered according to the occurrence of each pulses leading edge and the base level of one pulse can be the same as the top level of another pulse. Table 2 illustrates some of the characteristics of the composite pulse in FIG. 3 measured by the present invention, founded for simplicity are:

TABLE 2

| Pulse Number: | P1 | P2 | P3 | P4 | P5 |
|---|---|---|---|---|---|
| VOLTAGE: | 1.0 V | 1.0 V | 2.0 V | 1.0 v | −1.0 V |
| PULSE WIDTH: | 5.0 ms | 4.0 ms | 1.0 ms | 1.0 ms | 1.0 ms |
| SPACING: | 0.0 ms | 1.0 ms | 1.0 ms | 4.0 ms | 5.0 ms |
| DELAY FROM TRIGGER: | 0.5 ms | 1.5 ms | 1.5 ms | 4.5 ms | 5.5 ms |
| DC OFFSET: | 2.0 V | 3.0 V | 4.0 V | 4.0 V | 2.0 V |

In addition to the above measurements, the other parameters such as rise time and pulse droop can also be provided.

For the system to determine the signal characteristics as discussed above, the user must supply several filter related signal characteristics as well as information about the instrument being used. Device data which provides a description of the instrument used to collect the data and the state of the device at the time of measurement along with the array of digitized data needs to be provided by the user. The device data includes a starting cell location which is usually 1, the ending cell location which is usually the maximum number of cells on the time axis that the device is capable of digitizing. Both the horizontal (seconds/cell) and vertical (volts/cell) increments along with horizontal (time) and vertical (volts) values of the initial vertical and horizontal values are also provided as device data. The horizontal and vertical cells per division which indicates the resolution of the screen are provided as device data. Combining all of the above device data information, it is possible to determine the relative time and voltage of each individual cell location which is used to initialize the routines to be discussed in more detail later. The array of digitized data should be preconditioned (that is, checked for off scale voltage characteristics), integerized and scaled for maximum resolution, so that, if possible, the minimum voltage possible has a value of 1 cell and the maximum voltage has a value equal to the number of cells possible in the vertical direction. This can be accomplished by the oscilloscope operator adjusting the display so that the signal is as large as possible and centered in the screen. The term cell as used in the present invention refers to a display cell of the oscilloscope being used and is defined by two values a time width and a voltage height. The time width that a cell represents varies depending on the time scale selected on the scope. For example, if the display is 1024 cells wide and the time scale is set to a maximum width of 10 milliseconds each cell is 10/1024 milliseconds wide. The voltage height that a cell represents also varies depending on the voltage scale selected. For example, if the display is set to display from 0-5 volts and the display is 1024 high, each cell represents 5/1024 volts. The user must also specify the minimum pulse width expected expressed as a number of cells on the oscilloscope display being used where the default is one cell. For example, if the display is 1024 display cells wide, the display is displaying 10 milliseconds of data and the minimum pulse width is one millisecond the minimum pulse width would be 1024/10 or 102 cells. This value should be chosen carefully because any pulse width less than the minimum pulse width will be considered a glitch or spike and discarded. The minimum pulse width is used to verify that a full pulse edge (and not just a noise spike or glitch) has been found. In this situation the signal must remain outside a base filter value, to be discussed in more detail later, for at least a number of cells equal to the minimum pulse width to be considered a valid pulse edge. In addition, in locating the top of a pulse, the point to point slope of the signal must be less than a predetermined rise rate, to be discussed later, for at least the number of points set in the minimum pulse width to be considered a valid pulse top. The minimum pulse width number of cells for the pulse top is averaged as an initial guess at the pulse amplitude. In the special case where the pulse width of a pulse train is so narrow as to occupy only one display cell on the oscilloscope the pulse width minimum parameter should be set to zero. The user should also specify the peak voltage amplitude expected for the signal to be measured as measured from the DC offset position where the default is one cell. This is used as a multiplier with the maximum ringing value and the preshoot maximum value percentages, both to be discussed later, to obtain a representation of these parameters expressed as a voltage. This value is also used with the maximum rise time parameter and the maximum fall time parameter as a multiplier to guess the voltage travel during these times to determine a rise rate. The maximum ringing voltage input by the user is the maximum amount of peak to peak variance in the top of the pulse expected in the signal expressed as a percentage of the normal pulse amplitude. It is used to determine a top pulse filter, to be discussed in more detail later, which is the number of vertical cells the top of the pulse is permitted to vary where the default is one cell. The top pulse filter is used along with the minimum pulse width to determine whether a trailing edge has been encountered. A trailing edge is not considered to have been found until at least the minimum pulse width number of cells have been counted as falling outside the pulse top level by the top filter amount. A leading edge of a composite pulse is not considered found until at least the minimum pulse width number of cells have fallen outside the top filter amount from the previous pulse top (base reference level). The preshoot maximum parameter provided by the user is the maximum amount of peak to peak variation in the pulse baseline expressed as a percentage of the normal pulse amplitude. This value is used to determine a pulse base filter which is the number of vertical cells the base of the pulse is permitted to vary where the default is one cell. In determining the pulse baseline, points are averaged from the beginning of the data array until a point falls a number of cells away from the average by the base filter amount. A leading edge is not found until at least greater than or equal to the minimum pulse width number of cells fall at least the base filter number of cells away from the pulse base level. The maximum rise time parameter provided by the user is the maximum expected time required for a signal to rise from 10% to 90% of its peak voltage value. This value is used in conjunction with the peak voltage amplitude previously discussed to determine a rise rate which is the maximum point to point slope. Unless the rise rate proves to be a slope less than 45% from the pulse base, the rise rate is set equal to one. If greater than 45°, the rise rate is set equal to zero. In order to locate a pulse top, the point to point slope must be less than the rise rate for at least the minimum pulse width number of cells. The maximum fall time provided by the user is the maximum expected time required for a signal to fall from 90% to 10% of its peak voltage value. This value is used in conjunction with the expected peak voltage amplitude to determine a fall rate, which is the maximum point to point slope. Unless the rate proves to be a slope less than 45° from the pulse top, the fall rate is set equal to 1. If greater than 45°, the fall rate is set equal to zero. In order to locate a pulse base, the point to point slope must be less than the fall rate for at least the minimum pulse width number of cells. The user also specifies the minimum pulse depth which is used to detect a hole where the default is 3 dB. The user can also specify what percentage of the measured voltage value to use as the level for the pulse width, spacing and delay from trigger measurements. The default is 50%. When an AC signal is being measured the user can enter a value of 70.71% to measure the half power point of the AC pulse. The user can further specify the location of the cell which is the triggering position of the instrument which is used to calculate the delay from the trigger for each pulse although as previously indicated this information is provided as part of the device data.

Figure 4:
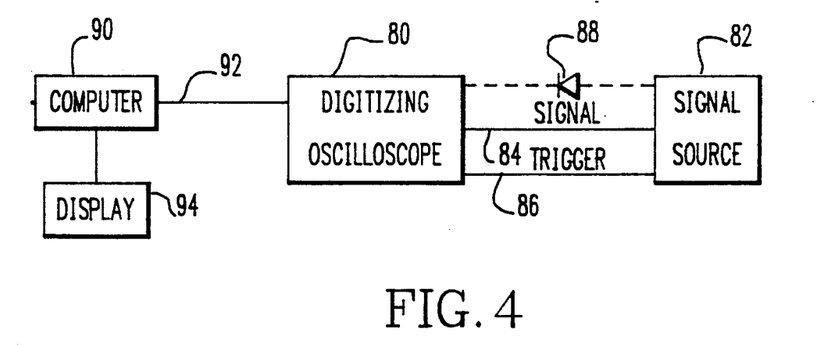
FIG. 4 illustrates the system of the present invention.

The present invention, as illustrated in FIG. 4, includes a conventional programmable digitizing oscilloscope 80 such as the Tektronix 2432 or the 2430A connected to a signal source 82 by a signal line and a trigger line 84 and 86. Of course any programmable digitizing oscilloscope could be substituted for the Tektronix scope. If the signal source is an AC signal source, an RF detector which is essentially a diode 88 is used in the signal path to the digitizing oscilloscope 80. The digitizing oscilloscope 80 is connected to a computer 90 by a IEEE-STD-488 interface bus 92. The computer 90 is preferably a VAX II GPX workstation computer available from Digital Equipment Corporation and the results are output to a conventional CRT display 94 or printer. The software of the present invention is preferably written in Ada however the "C" language, Fortran or any other language suitable for performing the calculations discussed herein can be used. The system preferably receives a complete waveform from the digitizing oscilloscope 80 over the bus 92 as 1024 data words of 8 bits each although the invention could be used with higher resolution samples. During operation signal source 82 provides a signal to the digitizing oscilloscope 80 for capture and display. This capture operation is performed by the oscilloscope 80 under control of the computer 90 using conventional commands transmitted over the bus 92. The signal characteristics, that is the voltage values for each time increment, are transmitted over bus 92 to the computer 90 where further analysis is performed to provide descriptive characteristics of the pulses in the signal supplied by signal source 82.

The basic operation of the digitizing oscilloscope is well known to those skilled in the art and will not be described herein in great detail. Briefly, the digitizing oscilloscope 80 obtains a plurality of amplitude measurements of the signal supply bus source 82 at different times over a time interval defined by time scale settings of the oscilloscope or by time scale settings provided by the computer system 90. These amplitude values are temporarily stored in the oscilloscope and may be displayed integral with the oscilloscope 80 or transferred to the computer system 90 in response to a conventional direct memory access command from the computer system 90. A more complete description of the construction and operation of the preferred oscilloscope is available from Tektronix Corporation and a more complete description of the operation of the interface bus is available from Tektronix or from Institute of Electrical and Electronic Engineers.

The measurement sequence performed by the present invention starts by setting up the oscilloscope based on the parameters discussed above describing the signal to be measured. These parameters are defined in terms of standard syntax as defined in IEEE-STD-716 C/ATLAS: pulsed DC Train (section 16.31) and Pulsed AC Train (section 16.29) incorporated by reference herein. The digitized signal and the associated parameters are read by the computer 90 from the oscilloscope 80 over the bus 92 in a conventional DMA transfer operation and provided to an analysis routine. The analysis routine initially sets up three noise immunity filters based on the signal parameters. The first pair of filters provide immunity to continuous random noise by setting minimum vertical excursions that can be considered significant. These filter values are determined and applied separately around the pulse baseline and pulse top to tailor the noise immunity characteristics to the signal at hand. A third filter is setup to provide immunity to large voltage variations that are of a short duration (glitches or spikes). This is done by setting a minimum time (or width) that is considered significant. These techniques provide noise immunity to both continuous noise and glitches in the signal sample. The analysis routine then processes the digitized data to determine the dc offset of the signal and locates the first rising edge of the pulse. To determine the dc offset, a rolling average of the sample is taken up to the point where the leading edge is first detected. This rolling average is used as a continuously updated baseline value for the signal. The baseline filter range is centered around the baseline and is used in detecting the edges of the pulse. The location of the leading edge is determined when enough points to exceed the glitch filter criteria are detected outside of the baseline filter range. In other words, the routine has located the start of a pulse, that is, a pulse both tall enough and wide enough to be considered valid. The final value of the rolling average (at the time the leading edge is detected) provides the dc offset or baseline value. The rolling average is also used when determining the baseline value for a succeeding pulse when the top of a preceding pulse is used as the baseline. The technique works equally well for both positive and negative going pulses. The algorithm then determines the location of the top of the pulse by locating the point where the rise rate of the pulse turns flat or turns back toward the baseline. Again, a sufficient number of points must be located to exceed the glitch filter criteria. The algorithm continues searching for the data for additional pulse edges. For single pulses the next edge will always be the falling edge associated with the previous rising edge. For composite signals this may or may not be the case. Therefore, the algorithm searches for either rising or falling edges and correlates the edges (left to right, top to bottom) until an individual pulse (one piece of the composite pulse) is determined. Bounded by the detected pulse region the specific parameters of that pulse are determined. Since the system calculates pulse parameters based on actual measured data, if the scaling factors of the instrument are set so that as much of a desired characteristic is displayed as possible, the accuracy of the measurements can be maximized. The edge correlation process is an important part of measuring composite signals since the found pulse is removed by "cutting off the pulse", (or removing the pulse from the sample data) after it has been located and quantified. After each pulse is located, quantified, stored, and cut off, the algorithm continues the search, correlation, characterization and removal process until no further pulses are detected. When all pulses have been analyzed, the parameters are sorted to comply with the PULSED DC TRAIN or PULSED AC TRAIN syntax as defined in IEEE-STD- 716 C/ATLAS. The analysis routine then returns the sorted parameters as well as status codes to provide for automatic re-ranging of the instrument in case of out-of-range conditions. The status codes indicate whether a particular parameter has been successfully calculated. The sorted parameters include the pulse characteristics previously discussed. The characteristics are then printed out on the printer, displayed on a CRT or transferred to the oscilloscope to indicate portions of the waveform to highlight.

A more detailed description of the specific implementation details concerning this technique is provided hereafter with respect to FIGS. 6-10, however, a graphical description of the operation of the present invention will be provided below to assist in understanding the invention.

To illustrate the operation of the present invention when a composite pulse is encountered, FIGS. 5A-5D which graphically illustrate the decomposition operation will be discussed. The routine starts (See FIG. 5A) at the left of the data array and walks to the right until a leading edge 100 and top 102 are located. The process continues locating pulse edges 104 and tops 106 until a trailing edge 108 is found. The location of a trailing edge defines a pulse bounded by the trailing edge and the most recently detected leading edge. The leading edge essentially defines the pulse height. With normal pulsed dc, the next edge will always be a trailing edge but for this composite pulse, two pulses need to be traversed before locating the trailing edge 108. Once the trailing edge 108 is found, the pulse corner points 110 are set or fixed and all characteristics for this pulse are calculated. The pulse corner points are the first and last points in the leading and trailing edges. The pulse characteristics are stored in an array in which the index is the number or count of the most recent leading edge. In this situation the count or index number is two. Next, the waveform data array is re-defined (See FIG. 5B) so that every data point considered part of the pulse is set equal to the pulse baseline (which is the previous top 102). That is, all points between and including the first point of the leading edge and the last point of the trailing edge are set equal to the baseline. The pulse is thus effectively cut off. The entire process now repeats, that is, the routine scans in from the left to locate edge 110 (originally edge 100) and top 112 (originally part of top 102) until a trailing edge 114 is found. This sets the corner points, allows calculation of the characteristics for this pulse (in this situation pulse two), and the pulse is cut off (See FIG. 5C). This cycle is repeated (See FIG. 5D) until all pulses have been processed and the data array is left as a flat line. The characteristic result array is then sorted according to occurrence of pulse leading edge and then the results are returned.

Figure 6:
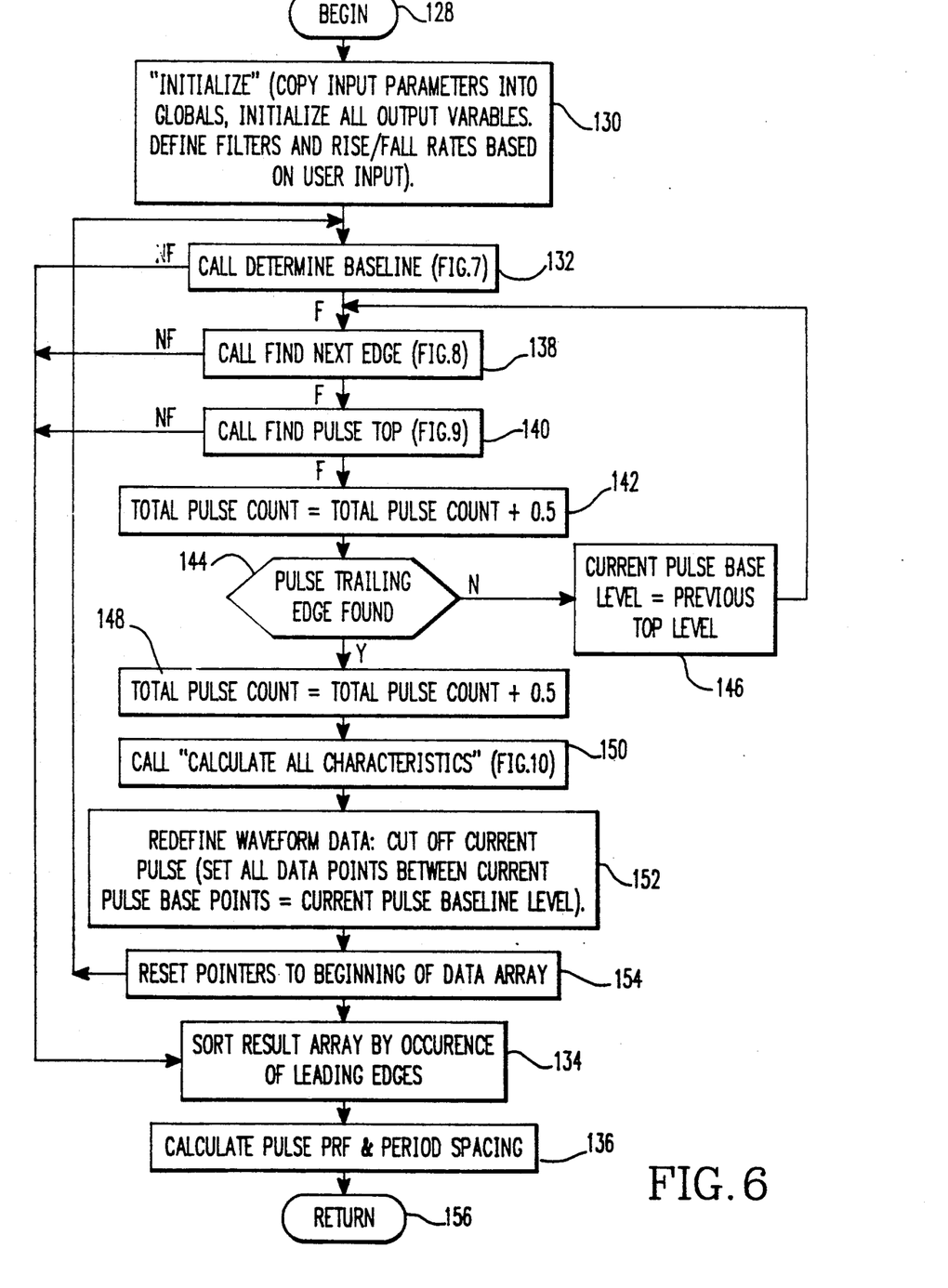
FIG. 6 is a flowchart of the main control procedure of the present invention.

The main procedure of the present invention, as illustrated in FIG. 6, is basically a loop structure which scans the entire waveform data array until the end of the array is reached. The routine first performs initialization by copying all the input parameters into globals, initializing all output variables defining the filters, as previously discussed, and the rise, fall rates and the minimum pulse widths, etc. based on user inputs. The routine then calls 132 the determine baseline routine of FIG. 7. If a baseline is not found (NF) during this process indicating that the end of the data array has been reached, the determine baseline routine exits to a step 134 which sorts the results array by the occurrence of the leading edges 134 and then calculates 136 the pulse spacing, pulse repetition frequency and the period between repeating pulses. Data is stored as a record which contains the baseline level, leading edge base point, leading edge top point, leading edge top level and pulse direction. An array of these records is generated with one record being created for each pulse encountered. The index into this array is the number of times block 146 is executed. Once a leading edge is detected, as will be discussed in more detail later, the latest array data is combined with the most previous array data and is used to form the pulse corner points. Once the points are located all the measured characteristics are calculated and stored in the results array. After all the pulses have been located and sorted by occurrence of the leading edge, the time between the 50% point on the leading edge of the first pulse and the 50% points on the leading edges of all other pulses is calculated. This data is then provided to the user as pulse spacing data. Once the spacing is calculated the pulse repetition frequency (PRF)=1/spacing for each pulse is produced. The user then visually correlates the calculated PRF to a repeating pulse pattern. For example, if the pulse train includes 8 pulses and the pulse repeats every three pulses, then the PRF for the fourth pulse is the PRF for the repeating pattern. Once the characteristics of the pulses are determined, because the locations of each pulse characteristic, such as the leading edge, are known, the locations can be fed back to the programmable digitizing oscilloscope and used by the oscilloscope to highlight the various critical points of the pulses. Along with the array of measured characteristics, for each pulse the system returns horizontal indicies which identify the 50% points of each pulse. If the display has a highlighting capability these points are used for controlling highlighting. Of course other points than the 50% points can be used to indicate signal features for highlighting.

Figure 5A:
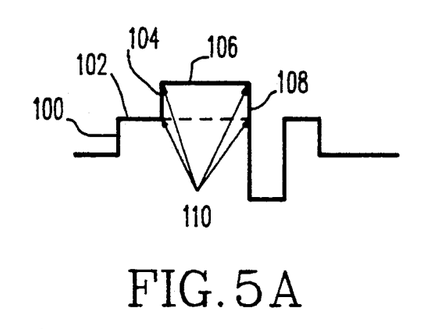
FIG. 5A-5D graphically illustrate pulse decomposition.
Figure 5B:
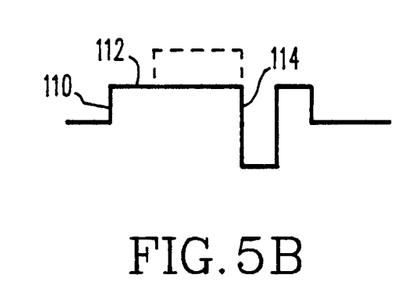
Figure 5C:
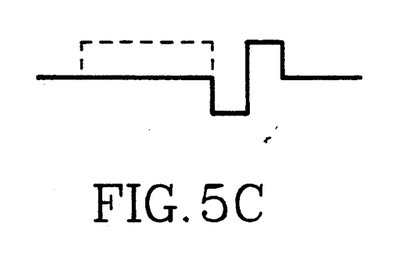
Figure 5D:
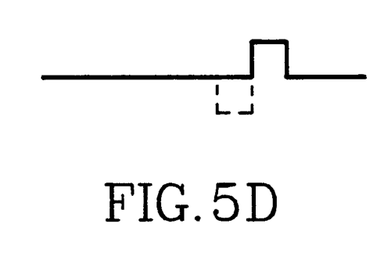
Figure 8A:
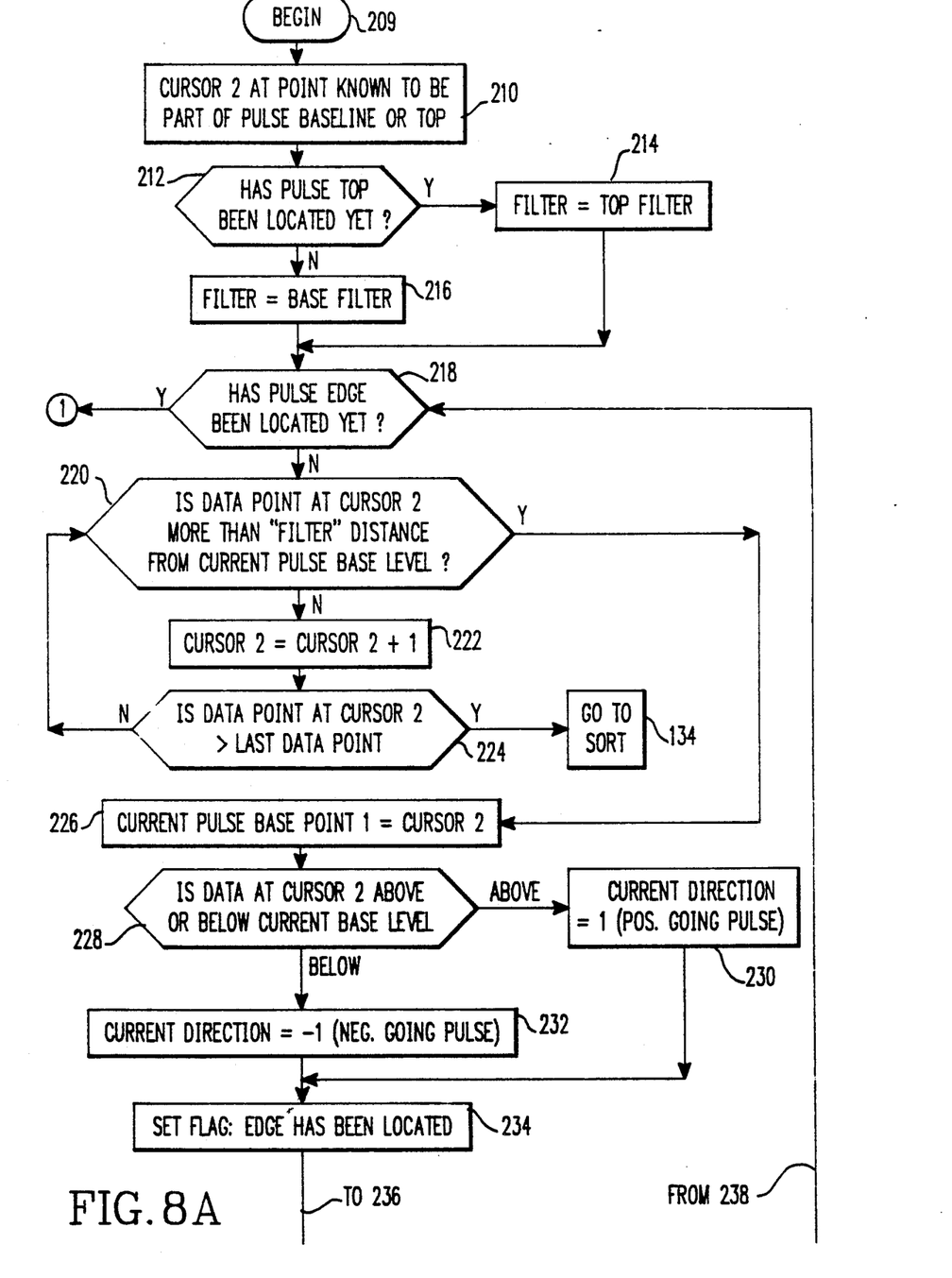
FIGS. 8A and 8B are a flowchart of the edge detection procedure called from FIG. 6.
Figure 8B:
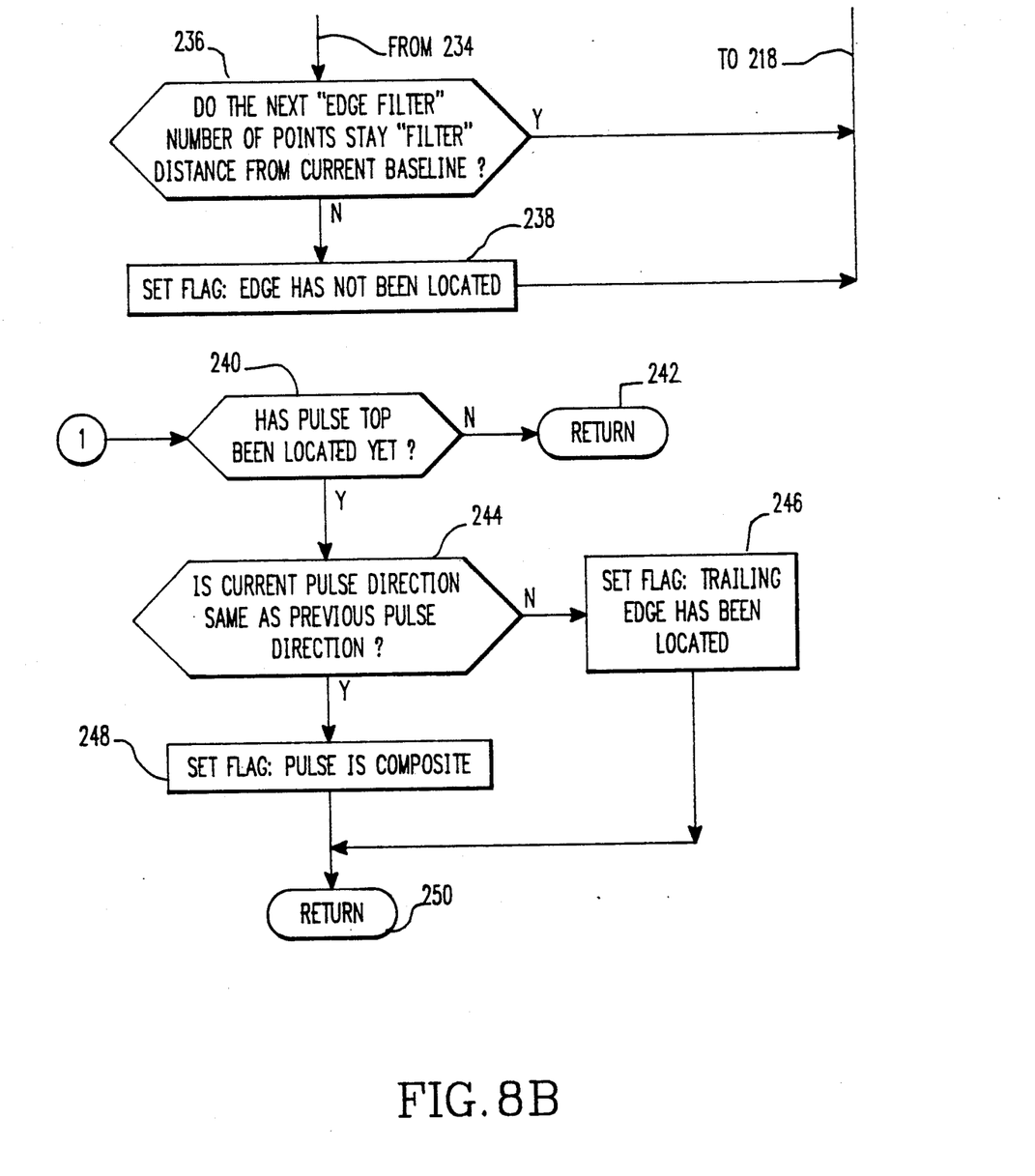
Figure 9A:
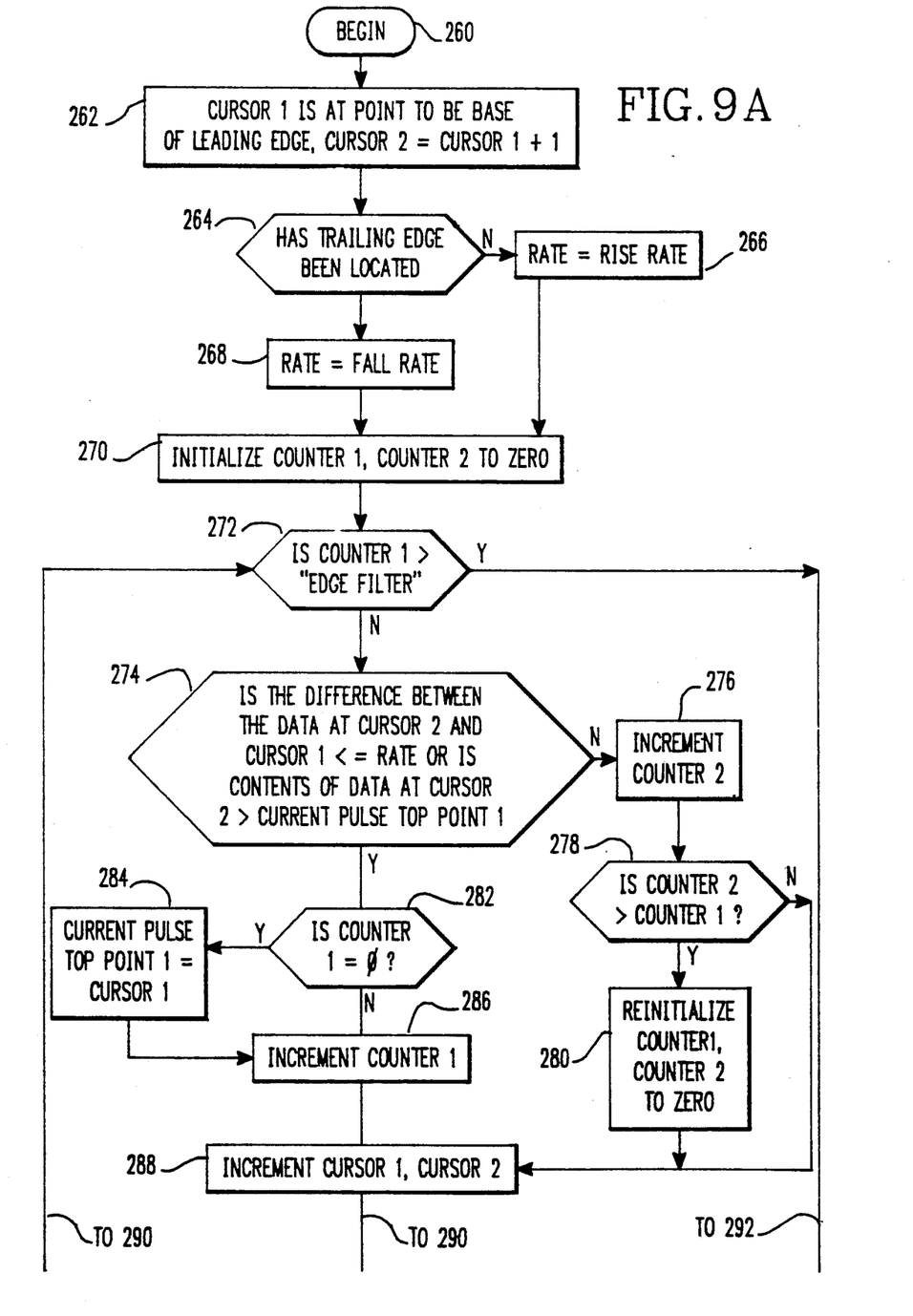
FIGS. 9A and 9B depict the flow of the pulse top detection procedure called from FIG. 6.
Figure 9B:
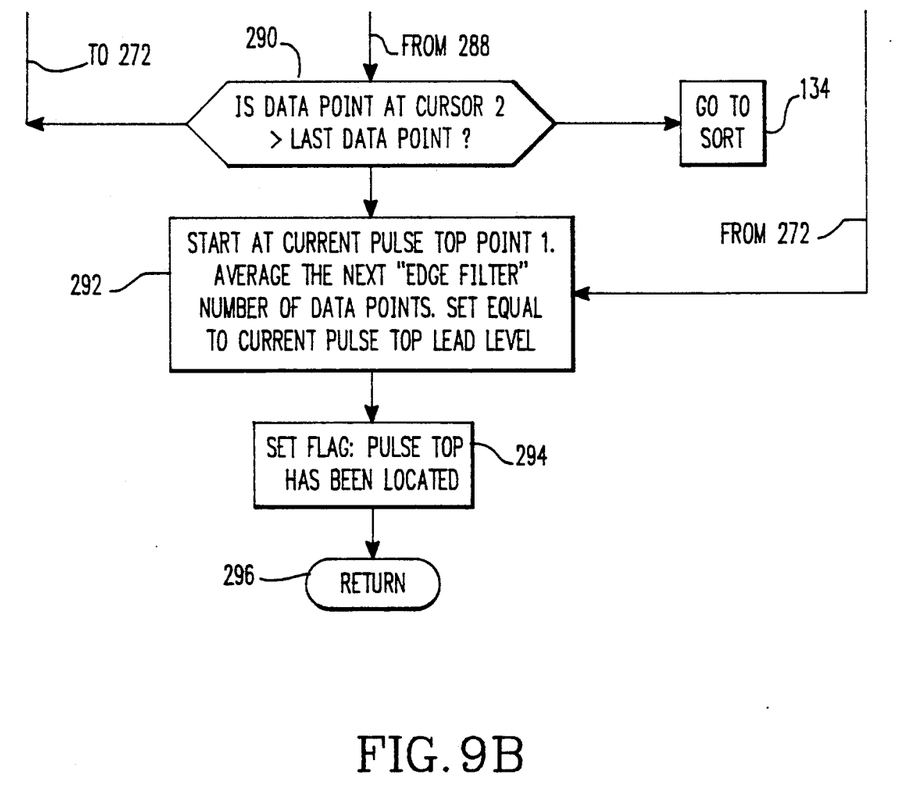

If the baseline is found, the main procedure next calls 138 the find next edge routine illustrated in FIGS. 8A and 8B. Once again if a next edge is not found an exit from this routine occurs to the sort step 134. If the next edge is found then the find pulse top routine is called 140 which is illustrated in FIGS. 9A and 9B. If the pulse top is found the pulse count is incremented by 0.5 indicating that ½ of the pulse has been found. The next edge routine, as will be discussed with respect to FIGS. 8A and 8B sets a flag which indicates whether the edge just detected is a trailing edge or a leading edge. If a trailing edge has not been found 144, then the current base level is set 146 equal to the previous top level. This is illustrated in FIGS. 5A and 5B where the top 102 became the base 112. The routine then loops back continuing to look for a trailing edge. This loop keeps locating the next edge, pulse top and updating the location of the next pulse base until a trailing edge is found. When a trailing edge is found the pulse count is updated 148 and the characteristics of the discovered pulse are calculated 150 as illustrated in more detail in FIG. 10. Next the waveform is redefined 152 by cutting off the current pulse which involves setting all the data points between the current pulse basepoints equal to the current pulse baseline level. The pointers to the data array are then reset 154 to the beginning of the array and the routine starts again.

Figure 7:
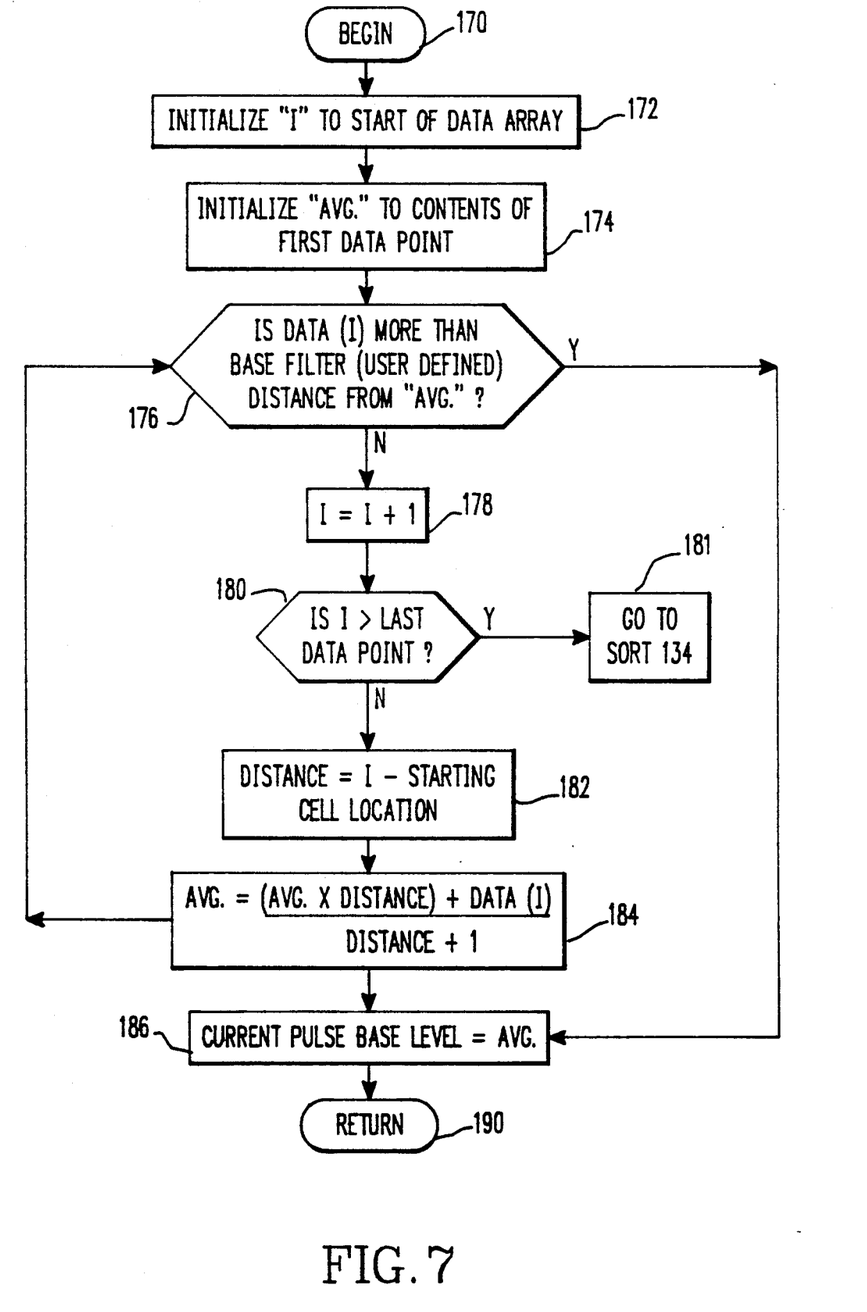
FIG. 7 illustrates the baseline routine called from FIG. 6.

The determine baseline routine illustrated in FIG. 7 essentially starts at the first cell in the waveform data array and walks through the array keeping a rolling average until a point falls outside of the number of cells away from the baseline set by the top of pulse or baseline filter. That is, if the rolling average is 10 and the filter is 5, then a potential edge is detected if the cell value is greater than 15 or less than 5. The detection of an edge is then verified by the routine of FIGS. 8A and 8B. The baseline determination routine starts by initializing 172 a pointer to the start of the data array and initializing 174 an accumulator for an average to the first data point (actually the first item in the data array). The routine then determines 176 whether the data point is more than a certain number of cells away from, less than or greater than, the average. If not, the pointer is incremented 178 and a determination is made 180 concerning whether this is the last point in the data array. If it is then the routine transfers back to the main procedure of FIG. 6 to block 134. If this is not the last data point the distance travelled through the data array is calculated 182 followed by a calculation 184 of the average. If the next data point (actually the next item in the data array) is more than the base filter distance from the average then the current pulse base level is set 186 to the average followed by a return. The cycle of checking and averaging continues until such a point is encountered.

The find next edge routine illustrated in FIGS. 8A and 8B verifies the detection of an edge basically by making sure that the data values stay the filter distance away from the baseline or from the top level for the minimum pulse width. The pulse direction is determined by comparing the edge amplitude with the base level. This procedure is called twice per pulse, once to discern the leading edge from the base, and again to discern the trailing edge from the pulse top. The routine starts at a point called cursor2 which is actually a pointer to an item in the data array known to be part of the pulse baseline or the top of the pulse because of the way the baseline or top routine executed immediately previous exited. The system determines 212 by examining a top located flag whether the top has been located. If the top has been located the system sets 214 the filter to the top filter. If the top has not been located, the system sets 216 the filter to the base filter. The filter value is determined by multiplying the user provided maximum voltage by either the ringing maximum percentage associated with the top of the pulse or the preshoot maximum percentage associated with the bottom of the pulse and dividing by the vertical increment. If the pulse edge has not been located 218, determined by checking the edge flag, the system then determines 220 whether the current data point is more than the filter distance from the current base level. This is essentially a slope threshold test. If it is not, then the data array pointer is incremented 222. If the new data point is the last data point, then the system branches to the sort step, 134 in FIG. 6. If it is not the last data point, the system keeps looking for a data point that satisfies the threshold test. When the threshold test is satisfied the current pulse basepoint is set 226 equal to the pointer value (cursor2). When a leading edge is being detected this point is the leading edge bottom corner point and when a trailing edge is detected this is the trailing edge top point. The pulse direction is determined 228 by determining whether the data at the pointer is above or below the base level. If the data is above the basic level, the direction pointer is set 230 to a positive one and if the data point is below the base level, the current direction is set 232 to negative one. This is followed by setting 234 the flag to indicate that the edge has been located. Next the system continues looking at points to determine whether the minimum pulse width for the number of points away from the baseline is satisfied 236. That is, the system continues to scan the data, compare the data to the filter value and count the number of points that are outside the filter threshold. When the minimum width count is reached and no point inside the filter threshold is encountered, this test 236 is satisfied and a return to test 218 occurs. If the minimum width criteria is not satisfied, the edge flag is reset 238 to indicate an edge has not been located and a return to the top of the routine occurs. If a pulse edge has been located in step 218 then a determination is made 240 concerning whether the pulse top has been located by checking the top flag. If a pulse top has been located, a determination 244 is made concerning whether the current pulse direction is the same as the previous edge direction. This is performed by comparing the edge direction value for the most recent pulse with the previous edge direction. If the direction is not the same, then the trailing edge located flag is set 246. If the pulse is in the same direction then a flag which indicates that the pulse a composite pulse is set 240.

The find pulse top routine is called twice per pulse, first to find the pulse top after finding the leading edge and again to relocate or locate a new baseline after finding the trailing edge. The top of a pulse can be the bottom of a negative going pulse such as P5 illustrated in FIG. 3. A top is basically located by starting near the edge base point and walking through the data array until the point to point slope is less than a specified rate. A specified rate is provided from the user inputs for maximum rise time and maximum fall time or is set to one in the initialization procedure. At the beginning of this routine the cursor1 pointer for the data array is located at a point which is known to be part of the base of the leading edge the first point of the edge. The cursor2 is set at 1 plus cursor1 and the current pulse top point is set at the baseline. Once this initialization has occurred, the system determines 264 whether a trailing edge has been located by examining the appropriate flag. If a trailing edge has not been located then the rate is set 266 at the rising rate. If the trailing edge has been located the rate is set 268 at the falling rate. In either case, counters associated with detecting the trend in the data are set 270 to 0. Next the system essentially performs a minimum pulse width detection operation by comparing the contents of counter1 to the edge filter value. If the test is not satisfied another test 274 which checks to determine whether the slope criteria has been satisfied or whether the slope has turned negative. If not, the second counter is incremented 276 followed by a test 278 to determine whether the second counter is greater than the first counter. This test is used to determine whether noise has been encountered. If so, counters are reinitialized to zero because the slope has not been maintained. If the test 274 is satisfied, a determination 282 is made concerning whether the counter1 is at zero and if so, the current pulse top point is set to the pointer value. This step 282 is executed when the proper slope is found and results in saving either the top front point of the pulse when the detected edge was a leading edge or the bottom trailing edge basepoint if the edge detected was a trailing edge. In either situation counter1 is incremented 286 followed by incrementing 288 the data pointers. The system then checks 290 to determine whether the data point is the last data point. If the minimum pulse width detection test 272 is satisfied, the routine starts 292 at the current pulse top point and averages the minimum pulse width number of data points and sets this equal to the current pulse top lead level which sets a new baseline value. This is equal to the current pulse base level discussed with respect to FIG. 6. Once the base level has been set, the flag indicating that the pulse top has been located is set 294.

Figure 10:
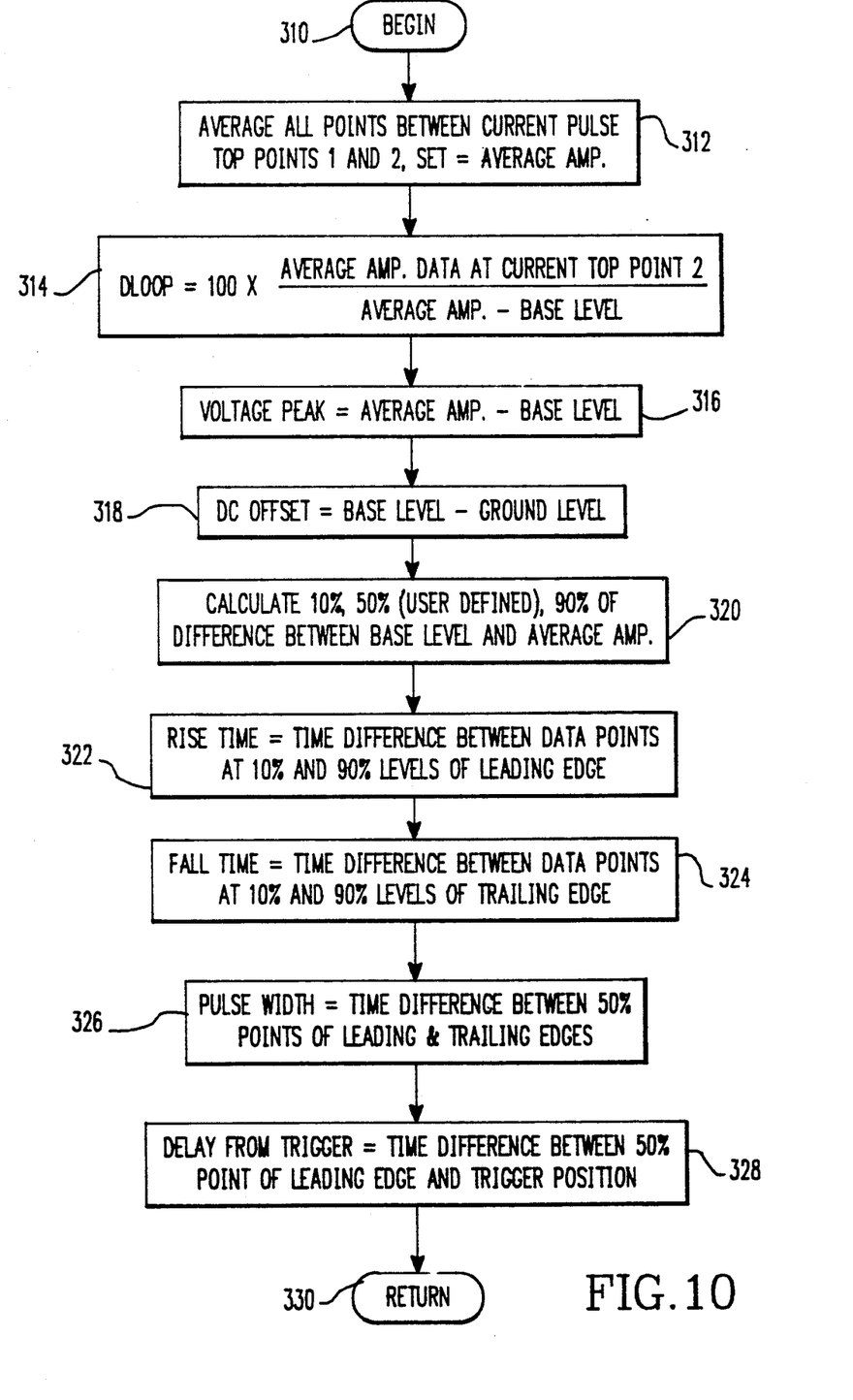
FIG. 10 illustrates the pulse characteristics calculation routine called from FIG. 6.

When a pulse has been located, the routine illustrated in FIG. 10 is executed. This procedure is a collection of calculations needed to obtain all the measured characteristics. First, all the points between the current pulse top points 1 and 2, where the top points 1 and 2 are the top corner front point and top corner rear point previously discussed, are averaged and set to the average amplitude. Next the droop 314 is calculated. If the pulse composite flag is set, the baselines for the pulse are compared and the point closest to the pulse top is chosen as the pulse base level. If the flag is not set then the line farthest from the pulse top is chosen as the base level. This is followed by calculation of the peak voltage 316 and the DC offset 318. Next, the 90%, 10% and user defined 50% levels are determined 320 and these points are located by scanning the edge data, followed by calculations to determine the rise time 322 and fall time 324. The pulse width is then calculated 326 followed by calculation of the delay 328. These values are all stored in an output array for the pulse identified.

The many features and advantages of the invention are apparent from the detailed specification and thus it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A pulse analysis system, comprising:
   capture means for capturing a pulse waveform; and
   analysis means for detecting a pulse by scanning and comparing waveform data points to a minimum pulse height and minimum pulse width wherein said analysis means detects a pulse edge by comparing the waveform data points to a minimum distance away from a rolling average.

2. The system as recited in claim 1, wherein said analysis means confirms detection of the edge by comparing the number of contiguous data points the minimum distance away from the rolling average to a minimum pulse width.

3. The system as recited in claim 2, wherein said analysis means detects a pulse top by, after an edge is detected, comparing the waveform data points to a point-to-point slope.

4. The system as recited in claim 3, wherein said analysis means confirms top detection by determining whether a minimum number of data points satisfy the slope.

5. A pulse analysis system, comprising:
   capture means for capturing a pulse waveform; and
   analysis means for detecting a pulse by scanning and comparing waveform data points to a minimum pulse height and minimum pulse width wherein said analysis means characterizes the pulse waveform by determining one of: pulse droop, rise time, fall time, width, amplitude, dc offset, count, spacing, delay, pulse repetition frequency and pulse period.

6. A pulse analysis system, comprising:
   capture means for capturing a pulse waveform; and
   analysis means for detecting, scanning and comparing waveform data points to a minimum pulse height and minimum pulse width, detecting a pulse edge by comparing the waveform data points to a minimum distance away from a rolling average, confirming detection of the edge by comparing the number of contiguous data points the minimum distance away from the rolling average to a minimum pulse width, detecting a pulse top by, after an edge is detected, comparing the waveform data points to a point-to-point slope, confirming top detection by determining whether a minimum number of data points satisfy the slope, and characterizing the pulse waveform by determining pulse droop, rise time, fall time, width, amplitude, dc offset, count, spacing and delay.

7. A method of analyzing pulses, comprising:
   (a) capturing a pulse waveform;
   (b) scanning the waveform to determine a pulse baseline;
   (c) scanning the waveform to detect a leading edge;
   (d) scanning the waveform to detect a pulse top;
   (e) scanning the waveform to detect a trailing edge; and
   (f) determining pulse characteristics when the trailing edge is detected wherein step (b) comprises averaging waveform data points until a data point exceeds a threshold around the average.

8. The method as recited in claim 7, wherein step (c) and step (e) comprise:
   (1) comparing waveform data points to a threshold; and
   (2) determining whether a minimum number of contiguous data points exceed the threshold once the threshold is crossed.

9. The method as recited in claim 7, wherein step (d) comprises:
   (1) comparing data points to a slope; and
   (2) determining whether a minimum number of contiguous data points satisfy the slope when the slope is detected.

10. A method of analyzing pulses, comprising:
    (a) capturing a pulse waveform;
    (b) scanning the waveform to determine a pulse baseline by averaging waveform data points until a data point exceeds a threshold around the average;
    (c) scanning the waveform to detect a leading edge by:
       (1) comparing waveform data points to a threshold; and
       (2) determining whether a minimum number of contiguous data points exceed the threshold once the threshold is crossed;
    (d) scanning the waveform to detect a pulse top by:
       (1) comparing data points to a slope; and
       (2) determining whether a minimum number of contiguous data points satisfy the slope when the slope is detected;
    (e) scanning the waveform to detect a trailing edge by:
       (1) comparing waveform data points to a threshold; and
       (2) determining whether a minimum number of contiguous data points exceed the threshold once the threshold is crossed;
    (f) determining pulse characteristics when the trailing edge is detected,
    (g) removing the pulse from the waveform; and
    (h) repeating steps (a)-(g) until all pulses have been removed from the waveform.

* * * * *